United States Patent [19]

Hammelsbacher

[11] Patent Number: 4,993,052

[45] Date of Patent: Feb. 12, 1991

[54] DIGITALLY-OPERATING ELECTRICAL EQUIPMENT WITH COUNTER FOR AUTOMATICALLY ADAPTING OUTPUT TO 50HZ OR 60HZ INPUT

[75] Inventor: Karlheinz Hammelsbacher, Schwabach, Fed. Rep. of Germany

[73] Assignee: Diehl GmbH & Co., Nuremberg, Fed. Rep. of Germany

[21] Appl. No.: 388,145

[22] Filed: Aug. 1, 1989

[30] Foreign Application Priority Data

Aug. 1, 1988 [DE] Fed. Rep. of Germany ....... 3826107

[51] Int. Cl.$^5$ ...................... G06M 3/02; G01R 23/15
[52] U.S. Cl. ...................... 377/52; 328/140; 307/524; 318/599; 377/2
[58] Field of Search ...................... 377/2, 52; 307/522, 307/524; 328/140; 318/599

[56] References Cited

U.S. PATENT DOCUMENTS

| | | | |
|---|---|---|---|
| 3,867,614 | 2/1975 | White | 377/52 |
| 4,052,676 | 10/1977 | Crittenden | 377/2 |
| 4,276,468 | 6/1981 | Nagamoto et al. | 377/2 |
| 4,339,722 | 7/1982 | Sydor et al. | 377/52 |
| 4,438,405 | 3/1984 | Yazawa et al. | 307/524 |
| 4,769,611 | 9/1988 | Frierdich | 328/140 |
| 4,823,060 | 4/1989 | Doemen | 328/140 |

Primary Examiner—John S. Heyman
Attorney, Agent, or Firm—Scully, Scott, Murphy & Presser

[57] ABSTRACT

A digitally-operating electrical appliance or equipment which is adapted to automatically handle power-supply or line frequencies of 50 Hz or 60 Hz. A full wave of the power-supply frequency is utilized for the generating of a waveform having a pulse referenced thereto. A pulse sequence which is generated independently of the power-supply frequency and is of an essentially higher frequency than the former is counted into a counter, and the content of the counter is thereafter discriminated at a threshold value of about 55 Hz. Depending upon the obtained result, a first signal is generated which is associated with the frequency of 50 Hz, or a second signal is generated which is associated with the frequency of 60 Hz, wherein the signals correspondingly switch a frequency divider to either a dividing ratio of 50:1 or 60:1 such that at the output of the frequency divider, independently of the power-supply frequency, there are generated pulses of a constant frequency for the synchronized power supply of the appliance.

5 Claims, 3 Drawing Sheets

Fig. 3
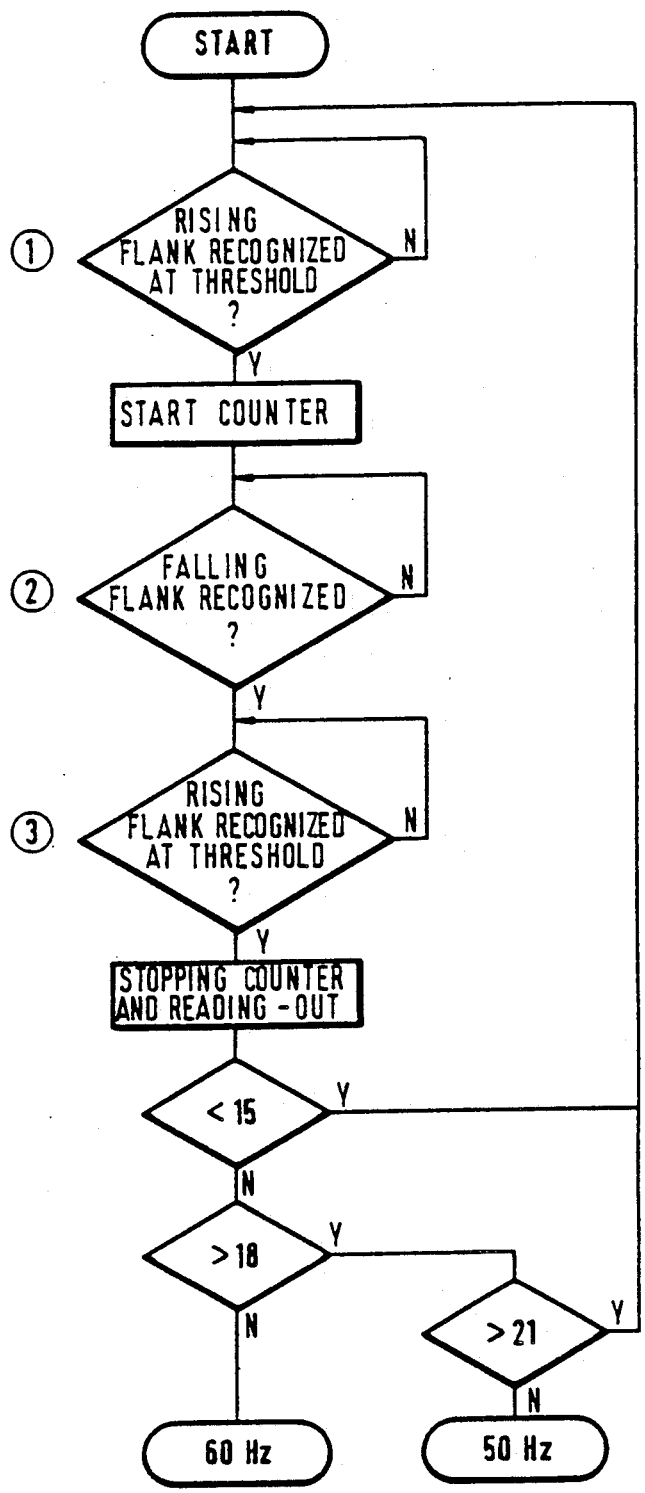
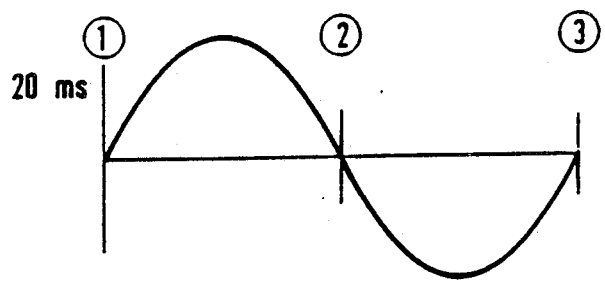

DIGITALLY-OPERATING ELECTRICAL EQUIPMENT WITH COUNTER FOR AUTOMATICALLY ADAPTING OUTPUT TO 50HZ OR 60HZ INPUT

BACKGROUND OF THE INVENTION

1. Field of the Invention

The present invention relates to a digitally-operating electrical appliance or equipment which is adapted to automatically handle power-supply or line frequencies of 50 Hz or 60 Hz.

2. Discussion of the Prior Art

The ordinarily employed power-supply or line frequencies in different countries are or appliances or equipment operating at 50 Hz or 60 Hz, which are not only for the domestic market, but are also intended for export, and consequently must be in a position to handle both 50 Hz or 60 Hz, for which purpose consumer appliances are usually equipped with a change-over switch for the selection between the two frequencies. Equipment or appliances which are sold in the OEM-business* or which handle larger power outputs, are already initially delivered while correlated to the correct frequency. This aspect necessitates an increased storage requirement with regard to the export trade.

*OEM=Original Equipment Manufacturer

SUMMARY OF THE INVENTION

Accordingly, it is an object of the present invention to provide an electrical appliance or equipment, which is in the position to handle both power-supply or line frequencies without the need for a change-over switch and without having to resort to any modifications from externally thereof.

The foregoing limitations and drawbacks which are encountered in the prior art are readily obviated through the present invention which has as its object the provision of a digitally-operating electronic appliance or equipment, which automatically handles power-supply frequencies of 50 Hz or 60 Hz, wherein a full wave of the power-supply frequency is utilized for the generating of a reference pulse; further in that from the beginning to the end of the reference pulse, a pulse sequence which is generated independently of the power-supply frequency and is of an essentially high frequency than the power-supply frequency is counted into a counter, and the content of the counter is thereafter discriminated at a threshold value of about 55 Hz and that finally, depending upon the result, there is generated a first signal which is associated with the frequency of 50 Hz or a second signal which is associated with the frequency of 60 Hz, wherein the signals corresponding switch a frequency divider to either a ratio of 50:1 or 60:1 such that at the output of the frequency divider, independently of the power-supply frequency, there are produced pulses of a constant or uniform-remaining frequency for the synchronized power supply of the appliance.

In essence, the invention is predicated upon the recognition of discriminating the pulses which are associated with the power-supply or line frequency and are employed for the generating of a signal which is associated with the frequency of either 50 Hz or 60 Hz; as a result of which a frequency divider has its dividing ratio switched to between 50:1 or 60:1, such that at the output thereof there are always generated pulses possessing the same frequency; for instance, of 1 Hz.

Further embodiments of the invention are elucidated in the following detailed description hereof. Hereby, important is the presence of a source for pulses which is independent of the power-supply frequency; for example, a quartz or (piezo) ceramic oscillator or resonator which is not influenced by the frequency fluctuations in the power supply.

BRIEF DESCRIPTION OF THE DRAWING

Reference may now be had to the following detailed description of two exemplary embodiments of the invention, taken in conjunction with the accompanying drawings; in which:

FIG. 3 illustrates a flow chart for the utilization of a microprocessor.

DETAILED DESCRIPTION

Figure 1:
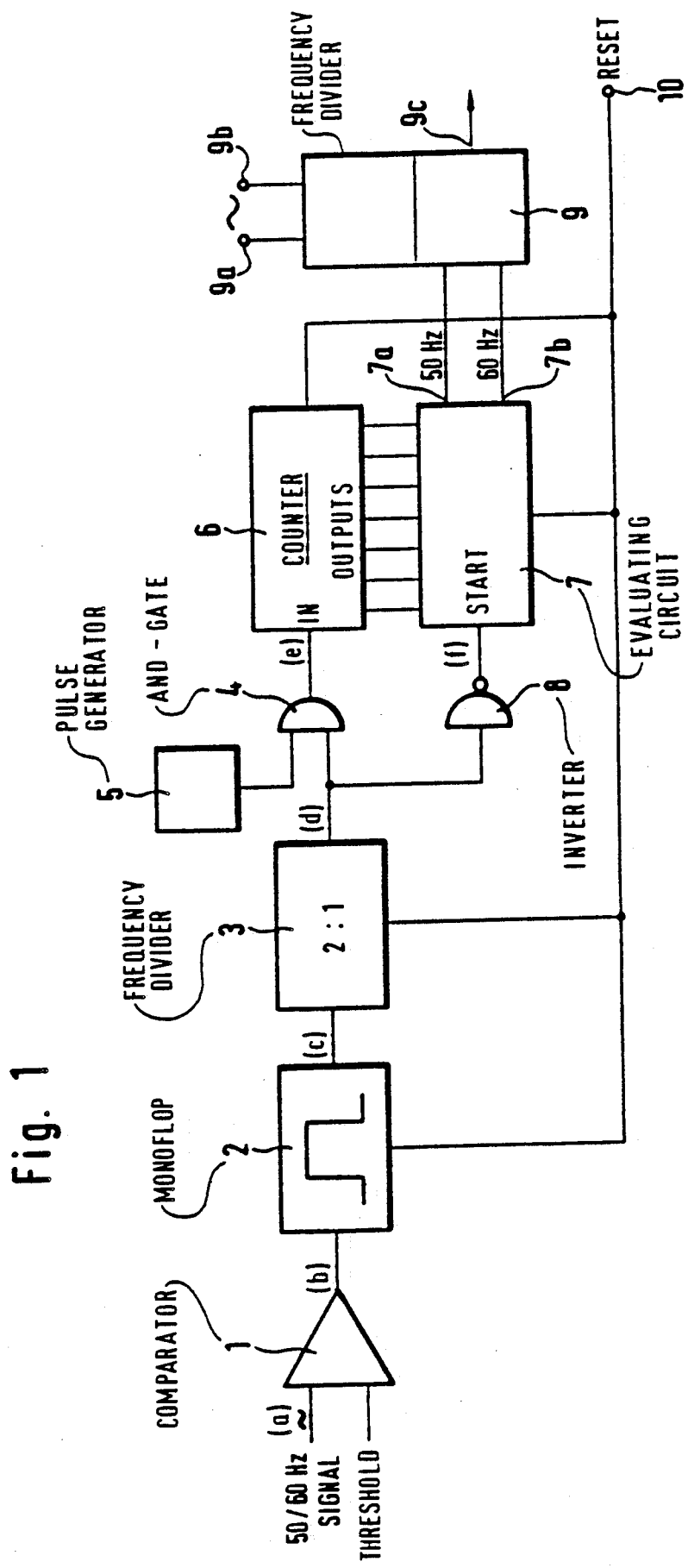
FIG. 1 illustrates a block circuit diagram of a first embodiment shown in a distinct circuit technology.

In the exemplary embodiment of FIG. 1, there is applied to the input of a comparator 1 the power-supply or line frequency of 50 Hz or respectively 60 Hz, as well as a continual signal for the generation of a voltage threshold. A monoflop 2 is connected to the output of the comparator, and upon the monoflop recognizing the rising flank or side of a signal at the output of the comparator, will emit a pulse of a defined length. Connected to the output of the monoflop 2 is a frequency divider 3 possessing a dividing ratio of 2:1. This frequency divider is likewise contacted with the rising flank of the signal which is present at the output of the comparator 1 and generates a signal with the half frequency of the power-supply frequency. The length of the pulses of the frequencies of the divider 3 is hereby dependent as to whether 50 Hz or 60 Hz are applied at the input of the comparator 1. The output signal of the frequency divider 3 is imparted to an input of an AND-gate 4, whose second input has the pulse series of a pulse generator 5 conducted thereto. This pulse generator must be independent of the power-supply frequency in the generating of its frequency, and is thereby expediently constructed as a quartz or (piezo) ceramic oscillator. Both pulse series are joined together in the AND-gate 4, and conducted to the input of a counter 6. This counter then counts pulses from the pulse generator 5 for such a period, as long as a pulse with a signal logic "1" is emitted by the frequency divider 3. An evaluating or sample-and-hold circuit 7 is connected to the output of the counter 6, and which circuit determines as to whether the number of the pulses which are present in the counter either exceed or fall below a prerequisite threshold value. An inverter 8 is arranged intermediate the output of the frequency divider and the evaluating circuit 7, which inverter is intended to ensure that an evaluation will only be carried out when the output signal of the frequency divider 3 stands on a logic signal "0", in effect the counter 6 is blocked. A frequency divider 9 is connected to the output of the evaluating or sample-and-hold circuit 7, the one input of the frequency divider having a signal transmitted thereto which is associated with the frequency of 50 Hz, and whose other input has a signal transmitted thereto which is associated with the frequency of 60 Hz. In the frequency divider, by means of these two signals the dividing ratio is switched over to 50:1 or 60:1. The frequency divider has the power-supply or line frequency conducted to its inputs 9a and 9b and there converted into square-wave pulses. Through the switching over of the dividing ratios, the power-supply frequency is always subdivided into a constant or uniform-remaining beat of 1 per second at the output 9c of the frequency divider. Finally, there is also provided an input 10 which receives a resetting signal at the first switching on of the appliance or equipment, which sets the counter 6 back and normalizes all remaining therewith connected components to the initial or starting condition.

Within the scope of the invention it is necessary to undertake the evaluation of a complete full-wave of a sinusoidal oscillation. In order to suppress any encountered disturbances or to compensate for deformations in the oscillation, it is expedient to commence the evaluation of a sinusoidal oscillation only first from a threshold of a pregiven or specified amplitude. Consequently, a full oscillation extends from the first exceeding of the threshold up to the subsequent exceeding thereof. For the obtaining of a good distinction between power-supply or line frequencies of 50 Hz and 60 Hz it is expedient to locate the frequency of the pulse generator 5 substantially higher than that of the power-supply frequency. For this purpose, a frequency of 1,000 Hz has been found to be satisfactory. This signifies, at a power-supply frequency of 50 Hz, a counter condition for the counter of 20 during a full oscillation. At a 60 Hz power-supply frequency, the condition of the counter is 16 during a full oscillation.

Figure 2:
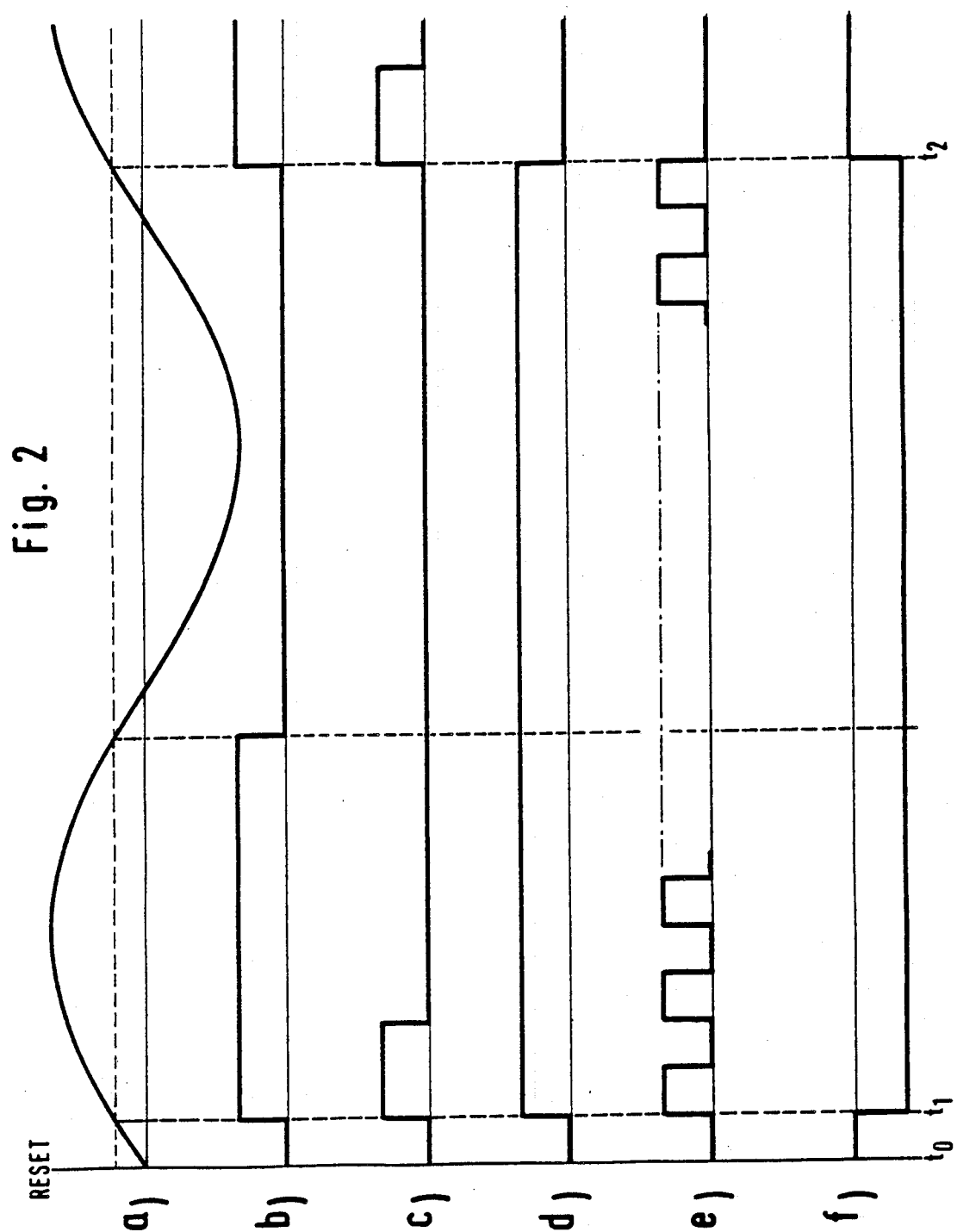
FIG. 2 illustrates a pulse diagram which is taken off from various switching points in FIG. 1.

On the basis of FIG. 2 there is now elucidated in closer detail the mode of operation of the arrangement which is shown in FIG. 1. In the pulse diagram, there is represented at 'a' a sinusoidal oscillation of the power-supply frequency, a 'b' the signal at the output of the comparator 1, at 'c' the output signal at the monoflop 2, at 'd' the output signal at the frequency divider, ar 'e' the input signal at the counter 6, and at 'f' the output signal at the inverter 8.

At the point in time $t_0$, the appliance or equipment is switched on for the first time, and a resetting signal is generated at the input 'c' which normalizes all components to the starting condition and sets back the counter 6. At the point in time $t_1$ the sinusoidal oscillation exceeds the threshold value and the evaluation commences. At the comparator 1 there is produced an output signal "1", concurrently an output signal '1' at the output of the monoflop 2, and also concurrently an output signal '1' at the output of the frequency divider 3. At this point in time, the pulse generator 5 already delivers output signals which, at the beginning of the signal at the output of the frequency divider 3, are conducted through in the AND-gate 4, and read into the counter 6 in correspondence with 'e'. With the generating of the output signal at the frequency divider 3, the signal is set to "0" at the output of the inverter 8. The evaluation procedure in the evaluating or sample-and-hold circuit 7 is thereby suppressed.

The duration of the output pulse from the frequency divider precisely corresponds with a full oscillation of the power-supply frequency. This signal is concurrent with the repeated rise of the pulse at the output of the monoflop 2. The AND-gate 4 blocks the further through connection of the pulse sequence from the pulse generator 5, and the counter remains at a standstill. At this point in time $t_2$ there is completed a full oscillation of the power-supply frequency, and the evaluation of the counter condition commences in that, at this point in time, the signal which is present at the output of the inverter 8 increases to "1". The discriminator which is built into the evaluating circuit 7 determines whether the condition of the counter either exceeds or falls below the specified threshold value 18 in accordance with the association to 55 Hz. When the threshold value is exceeded, this then signifies the presence of a power-supply frequency of 50 Hz, and a signal is generated at the output 7a of the evaluating circuit so as to switch the frequency divider 9 which is connected to the output thereof to a dividing ratio of 50:1. When, in contrast therewith, there is determined in the evaluating circuit a pulse count which is below the threshold value 18, then at the output 7b there is transmitted a signal to the frequency divider 9, which switches the dividing ratio of the latter to 60:1. The pulsing signal at the output 9c of the frequency divider always remains unchanged at 1 Hz.

For a circuit arrangement pursuant to FIG. 1, there can be eliminated the employment of the monoflop 2 and the frequency divider 3 when the counter 6 presently detects the beginning or the end of the counting sequence only upon the recognition of a rising flange of from "0" to "1".

In FIG. 3 there is illustrated a second exemplary embodiment of the invention; in essence, a flow diagram in the utilization of a microprocessor as an electronic control for the appliance or equipment, which concurrently also carries out the recognition of the power-supply frequency. Hereby, it is critical that there must be determined two rising flanks, interrupted through the recognition of a falling flank, as the characteristic of a full oscillation of the power-supply frequency. In the flow chart there is recognized at "1" a rising flank, associated with the beginning of the sinusoidal wave in the lower part of the figure, whereby the evaluation is always effected after the exceeding of a threshold. The counter in the microprocessor is then started. At "2" there is determined a falling flank at the dropping below the threshold and in the flow chart there is then awaited the subsequent rising flank and its exceeding the threshold value. This point in time 3 signifies the end of full oscillation of the power-supply frequency; and the counter is stopped, read out and thereafter discriminated. When the condition of the counter is <15 but not >18, then this represents the sign for the presence of a power-supply frequency of 60 Hz. When, in contrast therewith, the condition of the counter is >18 but <21, this represents a sign of the presence of a power-supply frequency of 50 Hz. However, when the condition of the counter is >21 or <15, then irregular conditions are present, and the microprocessor begins a renewed cycle in order to recognize the power-supply frequency. The switching over of a frequency divider 9 is then carried out in accordance with FIG. 1.

The invention is basically applicable to all digitally-operating electronic equipment or appliances with electrical line or power-supply; and their application is especially contemplated for electronic kitchen-range timers.

What is claimed is:

1. Digitally-operating electronic equipment, automatically handling power-supply frequencies of 50 Hz or 60 Hz; comprising means utilizing a full wave of the power supply frequency for generating a waveform having a pulse width referenced thereto; means connected to an output of said waveform generating means for counting into a counter, from the beginning to the end of the reference pulse waveform, a sequence of pulses generated independently of the power-supply frequency and which is of an essentially higher frequency than the power-supply frequency; means connected to an output of said counter for subsequently discriminating the content of the counter at a threshold value which is associated with about 55 Hz; finally in dependence upon the obtained result, means generating a first signal which is associated with frequency of 50 Hz or generating a second signal associated with a frequency of 60 Hz generated; and a frequency divider responsive to said first or second signal for switching respectively between a dividing ratio of either 50:1 or 60:1 so as to generate at an output of said frequency divider constant frequency pulses for said digital equipment synchronized to the power supply regardless of whether it is 50 Hz or 60 Hz.

2. Equipment as claimed in claim 1, comprising means generating a threshold value for fading down disturbances in the oscillation of the power-supply frequency, above which threshold value there commences the generating and terminating of the reference pulse waveform.

3. Equipment as claimed in claim 2, wherein said means for generating the threshold comprises a comparator.

4. Equipment as claimed in claim 1, wherein a monoflop and a further frequency divider connected to an output of said monoflop have the power-supply frequency conducted thereto for generating said reference pulse waveform.

5. Equipment as claimed in claim 1, wherein a pulse generator including a time normal which is independent of the power-supply frequency, such as a quartz or ceramic oscillator, generates the pulse sequence.

* * * * *